United States Patent
Ventrone et al.

(10) Patent No.: US 10,788,877 B1
(45) Date of Patent: Sep. 29, 2020

(54) TRANSITION ONCE MULTIPLEXER CIRCUIT

(71) Applicant: GLOBALFOUNDRIES INC., Grand Cayman (KY)

(72) Inventors: Sebastian T. Ventrone, South Burlington, VT (US); Lansing D. Pickup, Durham, NC (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/787,520

(22) Filed: Feb. 11, 2020

(51) Int. Cl.
| | |
|---|---|
| G06F 1/32 | (2019.01) |
| H03K 3/037 | (2006.01) |
| H03K 17/00 | (2006.01) |
| G06F 1/04 | (2006.01) |

(52) U.S. Cl.
CPC ............ *G06F 1/32* (2013.01); *G06F 1/04* (2013.01); *H03K 3/037* (2013.01); *H03K 17/005* (2013.01)

(58) Field of Classification Search
CPC .......... H03K 3/02; H03K 3/027; H03K 3/037; H03K 3/353; H03K 3/356052; H03K 3/356147; H03K 2217/0054; G06F 1/26; G06F 1/32
See application file for complete search history.

(56) References Cited

U.S. PATENT DOCUMENTS

| | | | |
|---|---|---|---|
| 6,054,877 A | 4/2000 | Ventrone | |
| 6,275,968 B1 | 8/2001 | Dean et al. | |
| 6,489,825 B1* | 12/2002 | Pasqualini | H03K 3/012 327/201 |
| 8,421,514 B1* | 4/2013 | Yeung | H03K 3/013 327/201 |
| 9,182,445 B2 | 11/2015 | Wong et al. | |
| 10,522,542 B1* | 12/2019 | Peng | H03K 17/6872 |
| 2007/0101304 A1 | 5/2007 | Bell et al. | |
| 2007/0139075 A1* | 6/2007 | Goel | H03K 3/356156 326/46 |
| 2010/0156494 A1* | 6/2010 | Turner | H03K 3/356147 327/202 |
| 2013/0169332 A1* | 7/2013 | Rahman | H03K 3/356 327/208 |

(Continued)

OTHER PUBLICATIONS

Rhyne "Fundamentals of Digital Systems Design" Prentice Hall NJ 1973 pp. 70-71 (Year: 1973).*

(Continued)

*Primary Examiner* — Jason Crawford
(74) *Attorney, Agent, or Firm* — David Cain; Hoffman Warnick LLC

(57) ABSTRACT

Embodiments of the disclosure provide a low power multiplexer (MUX) circuit, including: a first data input coupled to an input of a first pass gate device; a second data input coupled to an input of a second pass gate device; a hold latch having an input coupled to a data output of the MUX circuit and an output coupled to an input of a supplemental pass gate device; and a pulse generator for generating a HOLD pulse signal, wherein the HOLD pulse signal is coupled to a control input of the supplemental pass gate device. The hold latch is configured to hold a previously valid output data signal of the MUX circuit until a valid input data signal is available at the first data input or the second data input.

13 Claims, 5 Drawing Sheets

(56) References Cited

U.S. PATENT DOCUMENTS

2014/0298126 A1\* 10/2014 Sugiyama ...... G01R 31/318541
714/726
2017/0012611 A1\* 1/2017 Escobar ................ H03K 3/037

OTHER PUBLICATIONS

Ihrig, Colin J. et al.; "A Low-power CMOS Thyristor Based Delay Element With Programmability Extensions"; GLSVLSI'09; May 10-12, 2009; Copyright 2009; pp. 6.

\* cited by examiner

TRANSITION ONCE MULTIPLEXER CIRCUIT

BACKGROUND

The present disclosure relates to integrated circuits, and more specifically, to a transition once multiplexer circuit for reducing power consumption in integrated circuits.

Power consumption is an important consideration in integrated circuit design. One factor that leads to excessive power consumption is unnecessary node toggling. For example, the output of a given logic circuit (e.g., a multiplexer) might switch many times in a single clock cycle before settling down to its final value. This phenomenon is due to the fact that in a multi-input circuit, input signals may arrive at different times due to different path delays and load conditions. Each time an input signal arrives, it can cause a switch on the output, causing unnecessary multiple switches each cycle that increase active power yet have no redemptive value since they have no effect on the final logic state.

SUMMARY

A first aspect of the disclosure is directed to a low power multiplexer (MUX) circuit, including: a first data input coupled to an input of a first pass gate device; a second data input coupled to an input of a second pass gate device; a hold latch having an input coupled to a data output of the MUX circuit and an output coupled to an input of a supplemental pass gate device; and a pulse generator for generating a HOLD pulse signal, wherein the HOLD pulse signal is coupled to a control input of the supplemental pass gate device.

A second aspect of the disclosure is directed to a transition once multiplexer (MUX) circuit, including: a first data input coupled to an input of a first pass gate device; a second data input coupled to an input of a second pass gate device; a hold latch having an input coupled to a data output of the MUX circuit and an output coupled to a supplemental pass gate device; a pulse generator for generating a HOLD pulse signal, wherein the HOLD pulse signal is coupled to a control input of the supplemental pass gate; a first logic gate having a first input coupled to a select signal for selecting the first data input and a second input coupled to an output gating signal; and a second logic gate having a first input coupled to a select signal for selecting the second data input and a second input coupled to the output gating signal.

A third aspect of the disclosure is directed to a method for multiplexing, including: generating a HOLD pulse signal by: applying a clock input to a toggle input of a toggle latch to generate a first signal at an output of the toggle latch; applying a delay to the first signal to provide a second signal; and inputting the first and second signals to an exclusive OR (XOR) gate, the XOR gate outputting the HOLD pulse signal; outputting, based on the HOLD pulse signal, a previously valid input data signal held in a hold latch as a data output signal until a new valid input data signal is available; and outputting, based on an inverse of the HOLD pulse signal, the new valid input data signal as the data output signal.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements.

Figure 1:
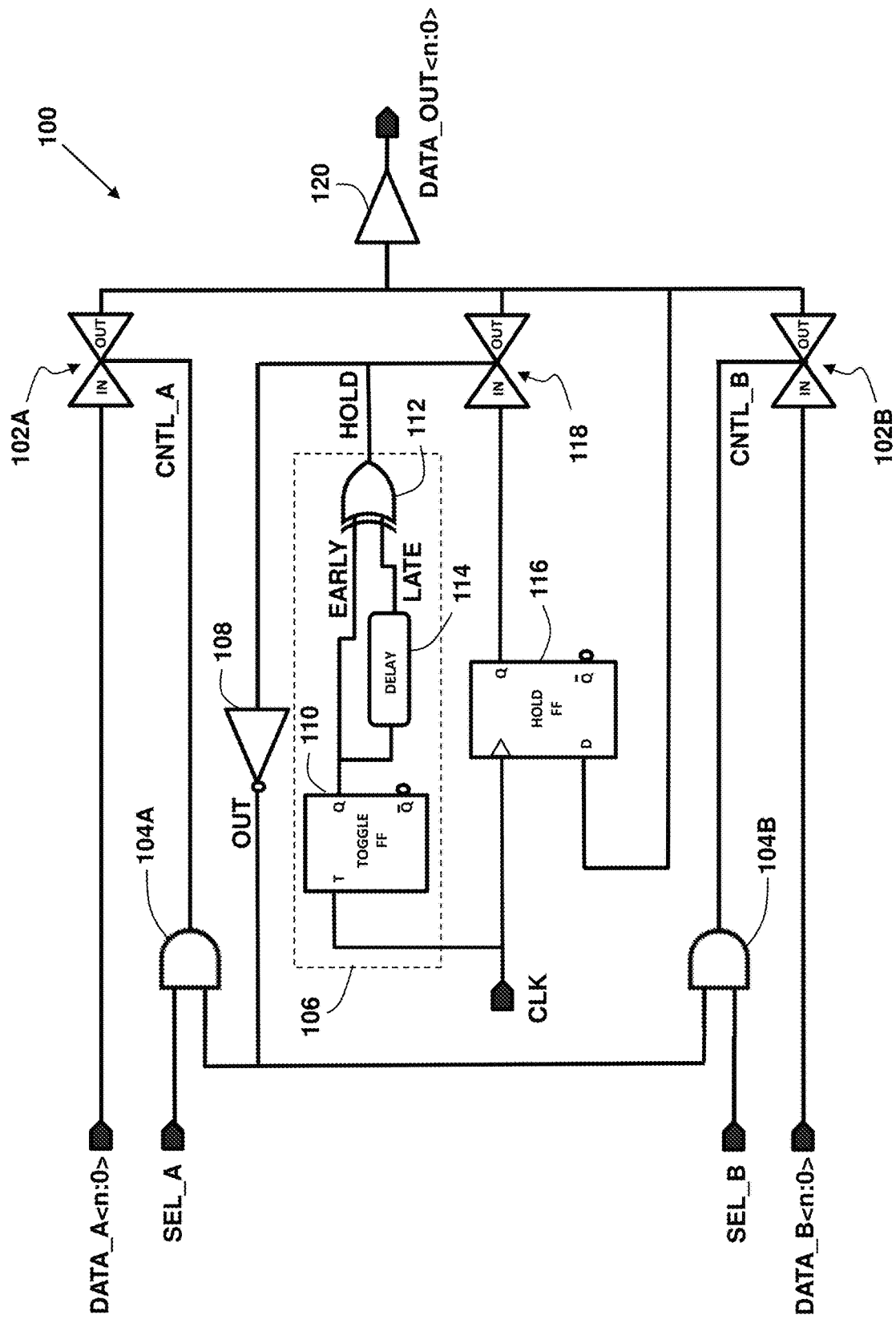
FIG. 1 depicts a transition once multiplexer circuit according to embodiments.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

A transition once multiplexer circuit according to embodiments is described herein. The multiplexer circuit is configured to provide output data signal transitions only for valid input data signals. The multiplexer circuit includes pass gate devices actuated in response to respective control signals. Each pass gate device is connected to a separate data input. Select inputs are provided to respective logic gates (e.g., AND gates) and are gated by an output gating signal. The output from each logic gate is provided to a respective pass gate device as the control signal. A pulse generator provides a HOLD pulse signal, which is passed through an inverter to provide the output gating signal to the logic gates.

An additional leg of the multiplexer circuit includes a supplemental pass gate device coupled to the output of a hold latch. The hold latch is configured to hold the previously valid (current) output data signal of the multiplexer circuit until a valid input data signal is available. The supplemental pass gate device is actuated by the HOLD pulse signal generated by the pulse generator. The HOLD pulse signal generated by the pulse generator allows the current state of the output data signal of the multiplexer circuit to be held in the hold latch for a set time after a clock transition (e.g., based on a programmable delay), temporarily blocking transitions on any data input from propagating to the data output of the multiplexer circuit.

A transition once multiplexer (MUX) circuit 100 (hereafter MUX circuit 100) according to embodiments is depicted in FIG. 1. The MUX circuit 100 includes a DATA_A input for receiving n-bit input data DATA_A, and a separate DATA_B input for receiving n-bit input data DATA_B. The DATA_A and DATA_B inputs are connected to the input ports of respective pass gate devices 102A, 102B. The pass gate devices 102A, 102B are controlled by respective control signals CNTL_A, CNTL_B (hereafter CNTL_A signal and CONT_B signal), which are applied to control inputs of the pass gate devices 102A, 102B, respectively. The MUX circuit 100 is configured to pass either the input data DATA_A at the DATA_A input or the input data DATA_B at the DATA_B input as n-bit output DATA_OUT based on the states of the CNTL_A and CNTL_B signals. The MUX circuit 100 may include a buffer 120 for buffering the output data DATA_OUT.

A select signal SEL_A for selecting the input data DATA_A at the DATA_A input is gated via an AND gate 104A by an output gating signal (OUT) to provide the CNTL_A signal to the pass gate device 102A. Similarly, a select signal SEL_B for selecting the input data DATA_B at the DATA_B input is gated via an AND gate 104B by the output gating signal to provide the CNTL_B signal to the pass gate device 102B. The select signals SEL_A, SEL_B are mutually exclusive, which provides the basic multiplexing functionality of the MUX circuit 100. A pulse generator 106 produces a HOLD pulse signal, which is fed through an inverter 108 to provide the output gating signal to the AND gates 104A, 104B.

The pulse generator 106 includes a toggle latch 110 which is toggled at its T input by a clock (CLK) signal. The Q output of the toggle latch 110, denoted EARLY, is coupled to an input of an exclusive OR (XOR) gate 112. The Q output of the toggle latch 110 is also coupled to an input of a delay block 114 (e.g., a delay line), which may be programmable. The output signal of the delay block 114, denoted LATE, is also coupled to an input of the XOR gate 112. The output of the XOR gate 112 is the HOLD pulse signal. The HOLD pulse signal is at a "1" state when the EARLY and LATE signals are at different logic states, e.g., when the EARLY signal is at a "0" state and the LATE signal is at a "1" state, or when the EARLY signal is at a "1" state and the LATE signal is at a "0" state. The HOLD pulse signal is at a "0" state when the EARLY and LATE signals are at the same logic state, e.g., when the EARLY and LATE signals are both at a "0" state or both at a "1" state.

The MUX circuit 100 further includes a hold latch 116 and a supplemental pass gate device 118 (hereafter pass gate device 118). The pass gate device 118, which is also controlled by the HOLD pulse signal applied to a control input of the pass gate device 118, is coupled to the Q output of the hold latch 116. According to embodiments, the hold latch 116 is configured to hold the previously valid (current) output data DATA_OUT of the MUX circuit 100 until valid input data is available.

The D input of the hold latch 116 is coupled to the output data DATA_OUT of the MUX circuit 100. The hold latch 116 is configured to capture, or 'latch' the output data DATA_OUT of the MUX circuit 100 at the D input when the CLK signal is at a "1" state. When the CLK signal input changes to a "0" state, the last state of the output data DATA_OUT of the MUX circuit 100 at the D input is trapped and held in the hold latch 116.

The Q output of the hold latch 116 (e.g., the previously valid (current) output data DATA_OUT of the MUX circuit 100) is coupled to the input of the pass gate device 118, which is controlled by the previously described HOLD pulse signal generated by the pulse generator 106. The DATA_OUT signal at the Q output of the hold latch 116 is passed to the output of the pass gate device 118 when the HOLD pulse signal is at a "1" state. As described above, the HOLD pulse signal is at a "1" state when the EARLY and LATE signals are at different logic states.

The MUX circuit 100 according to embodiments operates in accordance with several requirements:
A) No new input data is processed until a currently active select signal (e.g., SEL_A or SEL_B) is deselected. The previous select signal must be deselected at or before a new select occurs and before the previous input data changes.
B) No new select occurs before new input data is received.
C) If there is no select, output data must be held in the hold latch 116.
D) If the same select occurs, a deselect occurs during the data transition.

The pass gate device 118 is configured to pass the output data DATA_OUT of the MUX circuit 100 held in the hold latch 116 to the output of the MUX circuit 100 as long as the HOLD pulse signal is in the "1" state (e.g., as long as the EARLY and LATE signals have different logic states). According to embodiments, the amount of delay provided by the delay block 114 may be determined, for example, by analyzing the logic path to the MUX circuit 100 to determine the maximum length of time it takes for an input data signal (DATA_A, DATA_B) to settle down to a final, valid value at a data input of the MUX circuit 100. The delay provided by the delay block 114 may then be set to be greater than the maximum settling time, thereby preventing unnecessary transitions at the DATA_A and DATA_B inputs from propagating to the data output of the MUX circuit 100. Advantageously, this reduces the power consumption of, and associated with, the MUX circuit 100.

Figure 2:
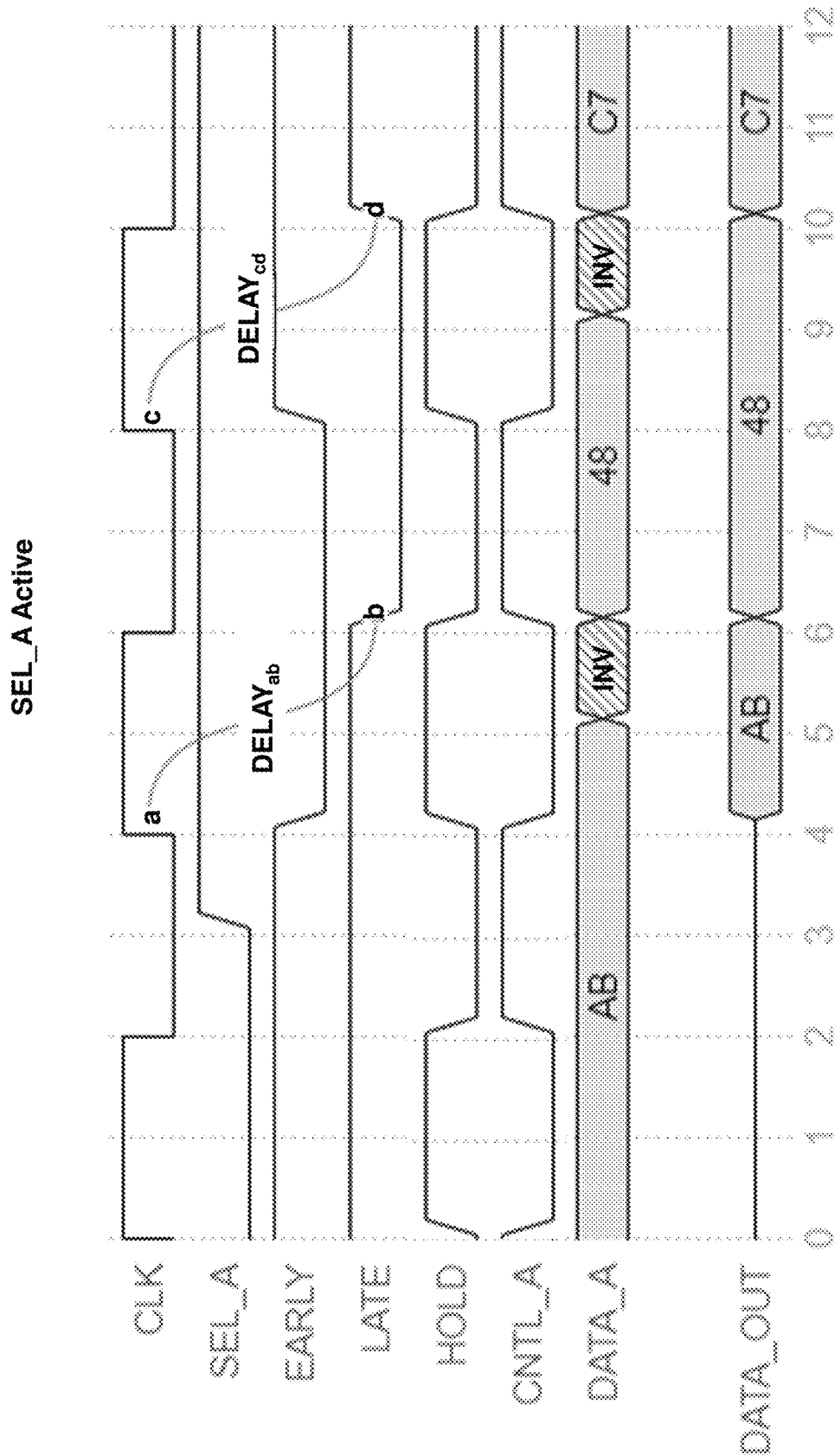
FIG. 2 depicts a timing diagram for the transition once multiplexer circuit of FIG. 1 according to embodiments.

An illustrative timing diagram for the MUX circuit 100 is depicted in FIG. 2. The timing diagram illustrates the case where SEL_A is active (at a "1" state) and different input data DATA_A (e.g., Aft 48, C7) is sequentially present at the DATA_A input. Invalid input data (e.g., unwanted transitions) at the DATA_A input are represented by the hatched areas between the input data AB and 48 and between the input data 48 and C7. The SEL_B leg of the MUX circuit 100 behaves in a similar manner.

When the select signal SEL_A, EARLY signal, and LATE signal are all at a "1" state, the HOLD pulse signal output by the XOR gate 112 is at a "0" state and the CNTL_A signal output by the AND gate 104A is at a "1" state. This allows the pass gate device 102A to pass the input data DATA_A (i.e., AB) at the DATA_A input to the output of the MUX circuit 100. The output data DATA_OUT (i.e., AB) of the MUX circuit 100 is also input into and held by the hold latch 116.

The EARLY signal subsequently transitions to a "0" state. However, the delay block 114 delays the transition of the LATE signal from a "1" state to a "0" state as represented by the DELAYab between points a and b in FIG. 2. With the EARLY signal at a "0" state and the LATE signal output by the delay block 114 at a "1" state, the HOLD pulse signal output by the XOR gate 112 is at "1" state and the CNTL_A signal output by the AND gate 104A is at a "0" state. This prevents invalid data (e.g., unwanted transitions) present at the DATA_A input from passing through the pass gate device 102A to the output of the MUX circuit 100. Instead, the output data DATA_OUT (i.e., AB) of the MUX circuit 100 currently held by the hold latch 116 is passed to the output of the MUX circuit 100 via the pass gate device 118.

After the LATE signal output by the delay block 114 subsequently transitions back to a "0", and with the EARLY signal remaining at a "0" state, the HOLD pulse signal output by the XOR gate 112 is at a "0" state and the CNTL_A signal output by the AND gate 104A is at a "1" state. This allows the pass gate device 102A to pass the valid input data DATA_A (i.e., 48) at the DATA_A input to the output of the MUX circuit 100. The output data DATA_OUT (i.e., 48) is also input into and held by the hold latch 116.

The EARLY signal subsequently transitions to a "1" state. However, the delay block 114 delays the transition of the LATE signal from a "0" state to a "1" state as represented by the DELAYcd between points c and d in FIG. 2. With the EARLY signal at a "1" state, and with the LATE signal output by the delay block 114 remaining at a "0" state, the HOLD pulse signal output by the XOR gate 112 is at "1" state and the CNTL_A signal output by the AND gate 104A is at a "0" state. This prevents invalid data (e.g., unwanted transitions) present at the DATA_A input from passing through the pass gate device 102A to the output of the MUX circuit 100. Instead, the output data DATA_OUT (i.e., 48) currently held by the hold latch 116 is passed to the output of the MUX circuit 100 via the pass gate device 118.

The output data (i.e., 48) held by the hold latch 116 and output by the MUX circuit 100 does not change until the LATE signal output by the delay block 114 transitions back to a "1" state. This prevents invalid data (e.g., unwanted transitions) present at the DATA_A input from passing to the output of the MUX circuit 100. After the LATE signal output by the delay block 114 subsequently transitions back to a "1" state, and with the EARLY signal output by the delay block 114 remaining at a "1" state, the HOLD pulse signal output by the XOR gate 112 is at a "0" state and the CNTL_A signal output by the AND gate 104A is at a "1" state. This allows the pass gate device 102A to pass the valid input data DATA_A (i.e., C7) at the DATA_A input to the output of the MUX circuit 100. The output data DATA_OUT (i.e., C7) is also input into and held by the hold latch 116.

Figure 3:
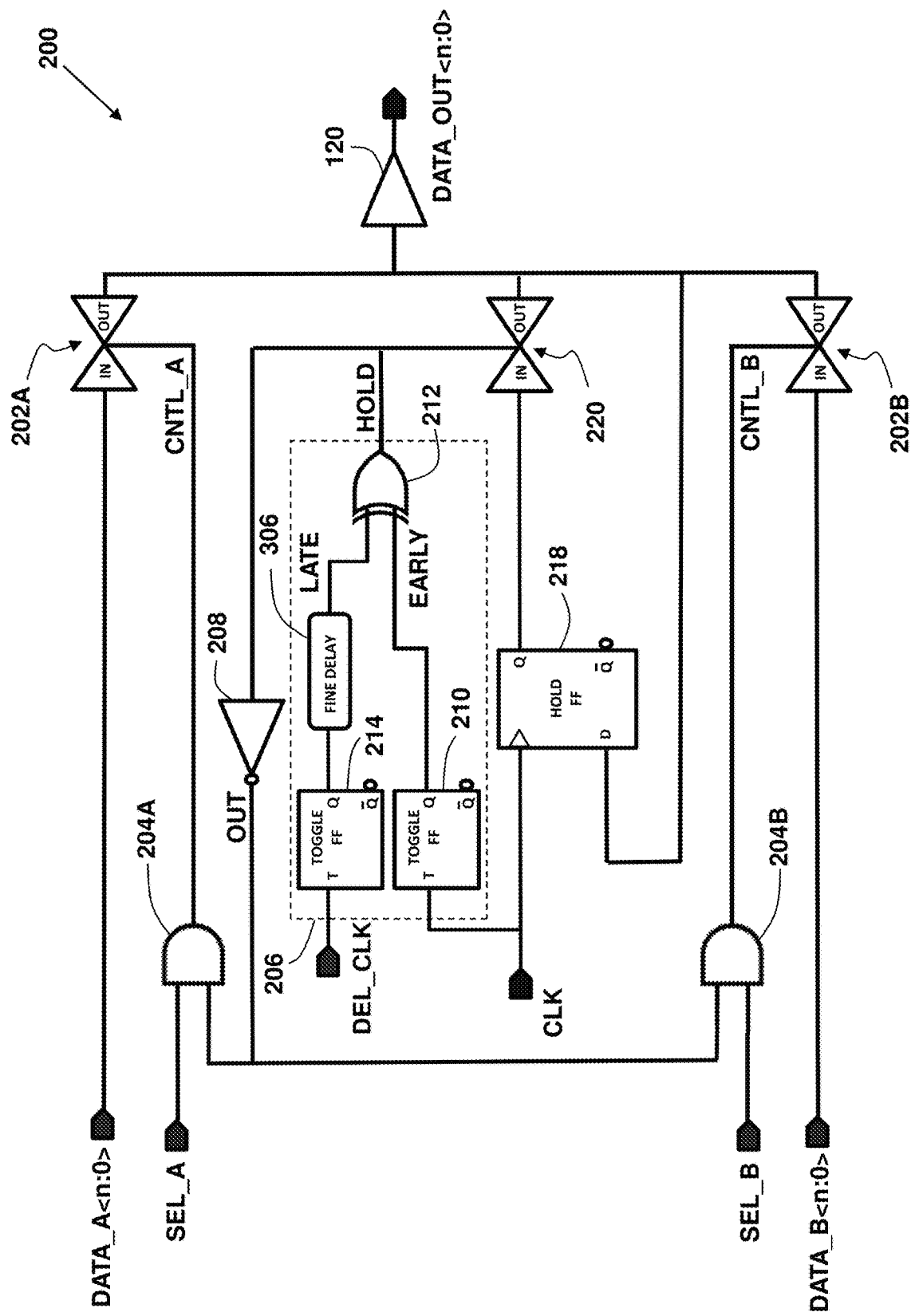
FIG. 3 depicts a transition once multiplexer circuit according to additional embodiments.
Figure 4:
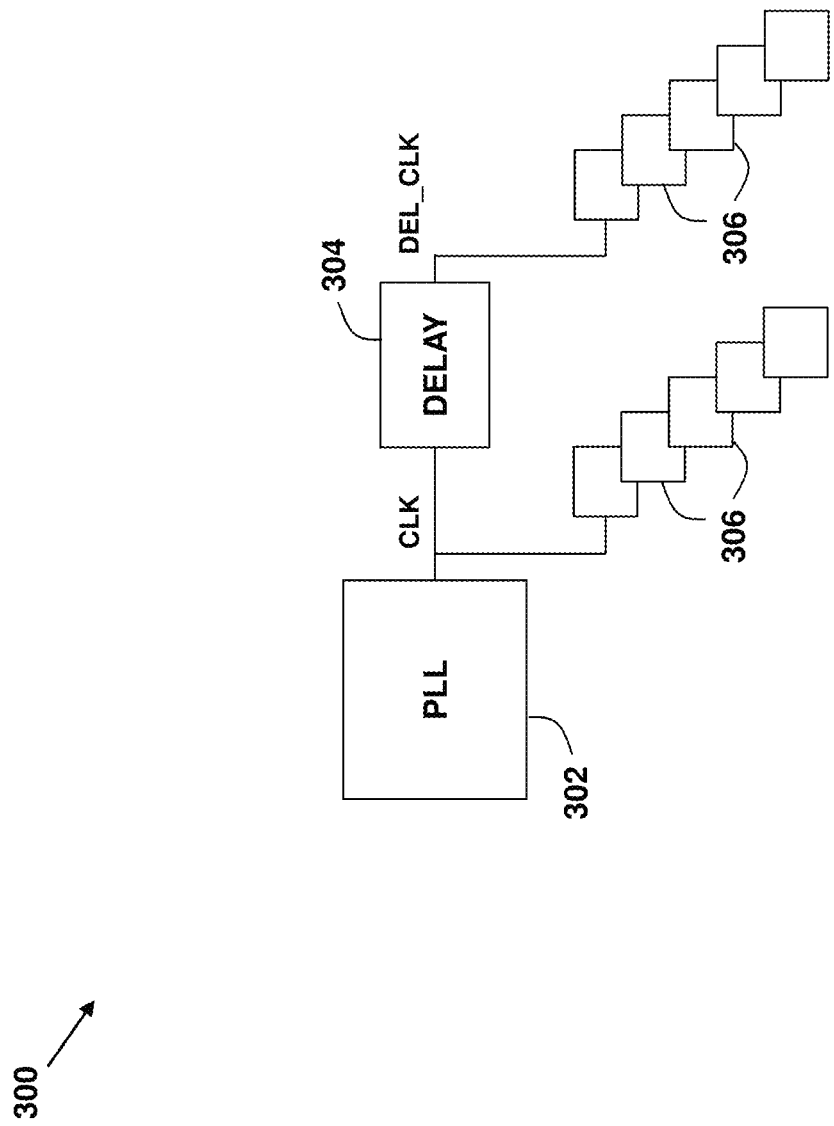
FIG. 4 depicts a shared clock tree for use with the transition once multiplexer circuit of FIG. 3 according to embodiments.

FIG. 3 depicts a transition once multiplexer circuit 200 (hereafter MUX circuit 200) according to additional embodiments. FIG. 4 depicts a shared clock tree network 300 for generating clock signals with various amounts of delay.

A shared clock tree network, such as the shared clock tree network 300 (hereafter clock tree 300) depicted in FIG. 4, is often used to provide clock signals having different amounts of delay to different circuits/components within an integrated circuit or device. A non-delayed clock (CLK) signal may be generated using a circuit such as a phase-locked loop 302. The CLK signal may be cascaded through one or more delay blocks 304 (e.g., delay lines), each of which delays the clock signal inputted therein by a predetermined amount of time, to provide at least one delayed clock (DEL-CLK) signal. Each of the delay blocks 306 represent the maximum length of time (e.g., FINE DELAY) it takes for an input data signal (e.g., DATA_A, DATA_B) to settle down to a final, valid value at a data input of a circuit (e.g., MUX circuit 200).

Referring now to FIG. 3, the MUX circuit 200 includes a DATA_A input for receiving n-bit input data DATA_A, and a separate DATA_B input for receiving n-bit input data DATA_B. The DATA_A and DATA_B inputs are connected to the input ports of respective pass gate devices 202A, 202B. The pass gate devices 202A, 202B are controlled by respective control signals CNTL_A, CNTL_B, which are applied to control inputs of the pass gate devices 202A, 202B, respectively. The MUX circuit 200 is configured to pass either the input data DATA_A at the DATA_A input or the input data DATA_B at the DATA_B input as n-bit output DATA_OUT based on the states of the CNTL_A and CNTL_B signals. The MUX circuit 200 may include a buffer 120 for buffering the output data DATA_OUT.

A select signal SEL_A for selecting the input data DATA_A at the DATA_A input is gated via an AND gate 204A by an output gating signal (OUT) to provide the CNTL_A signal to the pass gate device 202A. Similarly, a select signal SEL_B for selecting the input data DATA_B at the DATA_B input is gated via an AND gate 204B by the output gating signal to provide the CNTL_B signal to the pass gate device 202B. A pulse generator 206 produces a HOLD pulse signal, which is fed through an inverter 208 to provide the output gating signal to the AND gates 204A, 204B.

The pulse generator 206 includes a first toggle latch 210 that is toggled at its T input by a clock (CLK) signal (e.g., the CLK signal produced by the PLL in FIG. 3). The Q output of the toggle latch 210, denoted EARLY, is coupled to an input of an exclusive OR (XOR) gate 212. The pulse generator 206 further includes a second toggle latch 214 that is toggled at its T input by a delayed clock (DEL_CLK) signal (e.g., the DEL_CLK signal output by the delay block 304 in FIG. 3). The Q output of the toggle latch 214 is coupled to an input of a delay block 306 (e.g., a delay line), which may be programmable. According to embodiments, as previously described with regard to FIG. 4, the delay block 306, labeled FINE DELAY, represents the maximum length of time it takes for an input data signal (e.g., DATA_A, DATA_B) to settle down to a final, valid value at a data input (e.g., DATA_A input, DATA_B input) of the MUX circuit 200.

The output signal of the delay block 306, denoted LATE, is also provided to an input of the XOR gate 212. The output of the XOR gate 212 is the HOLD pulse signal. The HOLD pulse signal is at a "1" state when the EARLY and LATE signals are at different logic states (e.g., "1", "0" or "0", "1"). The HOLD pulse signal is at a "0" state when the EARLY and LATE signals are at the same logic state, e.g., (e.g., "0", "0" or "1", "1").

Similar to the MUX circuit 100, the MUX circuit 200 further includes a hold latch 218 and a supplemental pass gate device 220 (hereafter pass gate device 220). The pass gate device 220, which is controlled by the HOLD pulse signal generated by the pulse generator 206 and applied to a control input of the pass gate device, is coupled to the Q output of the hold latch 216. According to embodiments, the hold latch 216 is configured to hold the previously valid (current) output data DATA_OUT of the MUX circuit 200 until valid input data is available.

The D input of the hold latch 216 is coupled to the output data DATA_OUT of the MUX circuit 200. The hold latch 216 is configured to capture, or 'latch' the output data DATA_OUT of the MUX circuit 200 at the D input when the CLK signal is at a "1" state. When the CLK signal input changes to a "0" state, the last state of the output data DATA_OUT of the MUX circuit 200 at the D input is trapped and held in the hold latch 216.

The Q output of the hold latch 216 (e.g., the previously valid (current) output data DATA_OUT of the MUX circuit 200) is coupled to the input of the pass gate device 218, which is controlled by the previously described HOLD pulse signal. The DATA_OUT signal at the Q output of the hold latch 216 is passed to the output of the pass gate device 218 when the HOLD pulse signal is at a "1" state. As described above, the HOLD pulse signal is at a "1" state when the EARLY and LATE signals are at different logic states (e.g., "0", "1" or "1", "0").

Again, similar to the MUX circuit 100, the MUX circuit 200 according to embodiments operates in accordance with several requirements:
A) No new input data is processed until a currently active select signal (e.g., SEL_A or SEL_B) is deselected. The previous select signal must be deselected at or before a new select occurs and before the previous input data changes.
B) No new select occurs before new input data is received.

C) If there is no select, output data must be held in the hold latch 212.

D) If the same select occurs, a deselect occurs during the data transition.

The pass gate device 218 is configured to pass the output data DATA_OUT of the MUX circuit 200 held in the hold latch 216 to the output of the MUX circuit 200 as long as the HOLD pulse signal is in the "1" state (e.g., as long as the EARLY and LATE signals have different logic states). According to embodiments, the amount of delay (FINE DELAY) provided by the delay block 306 may be determined, for example, by analyzing the logic path to the MUX circuit 200 to determine the maximum length of time it takes for an input data signal (DATA_A, DATA_B) to settle down to a final, valid value at a data input of the MUX circuit 200. The delay provided by the delay block 306 may then be set to be greater than the maximum settling time, thereby preventing unnecessary transitions at the DATA_A and DATA_B inputs from propagating to the data output of the MUX circuit 200. Advantageously, this reduces the power consumption of, and associated with, the MUX circuit 200.

Figure 5:
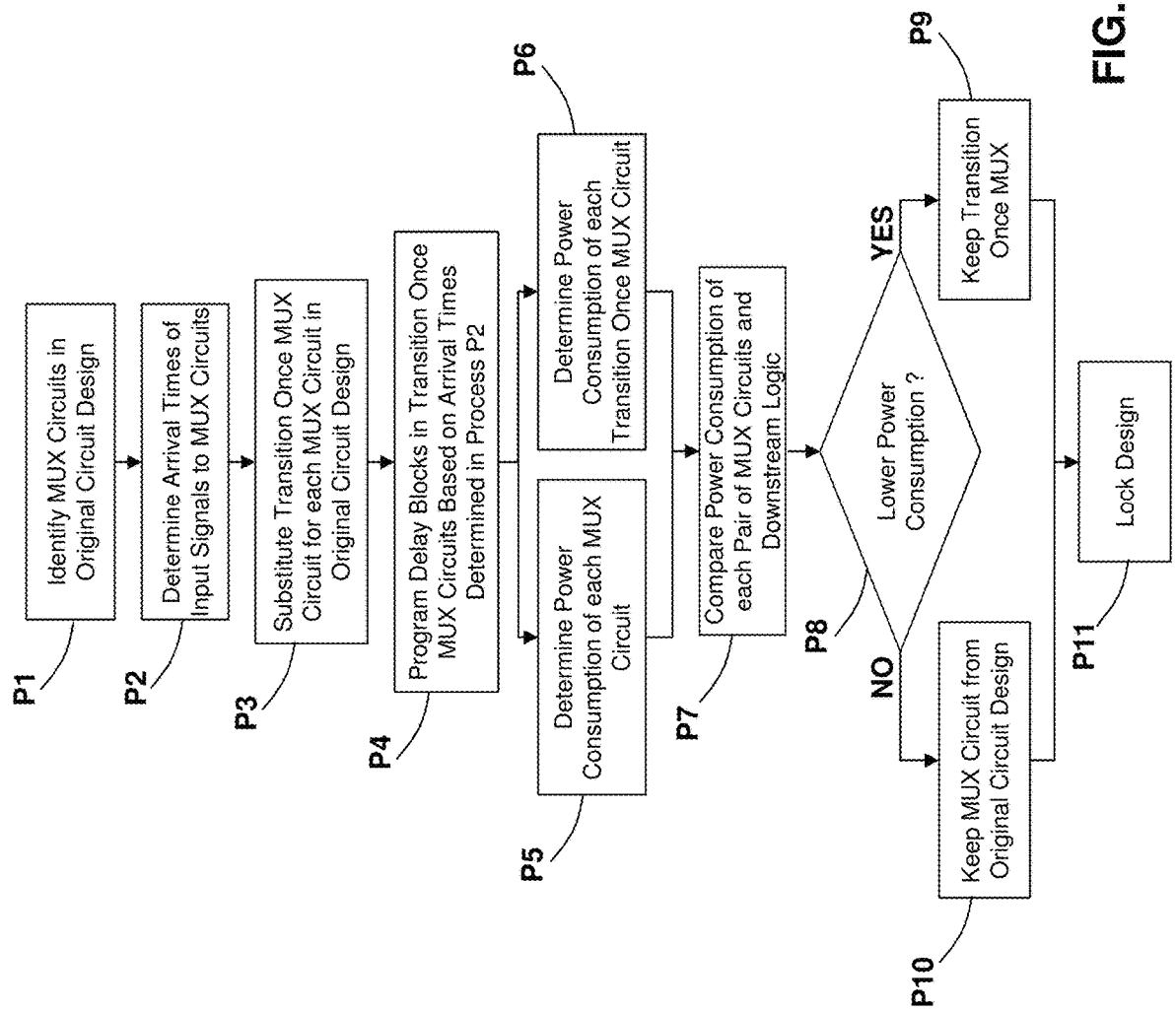
FIG. 5 is a flow diagram of a process for incorporating transition once multiplexers into an existing circuit design according to embodiments.

FIG. 5 is a flow diagram of a process for incorporating transition once multiplexers into an existing circuit design according to embodiments. This process may be performed, for example, to reduce the power requirements of the existing circuit design.

At process P1, an original circuit design is analyzed to identify all MUX circuits in the original circuit design. At process P2, the arrival times of input signals to each MUX circuit in the original circuit design are determined (e.g., extracted via simulation from the circuit design). At process P3, a transition once MUX circuit according to embodiments is substituted for each MUX circuit in the original circuit design to provide a modified circuit design. At process P4, the delay provided by the delay block in each MUX circuit (e.g., delay block 114 (FIG. 1), fine delay block 306 (FIG. 3)) is programmed/tuned in accordance with the arrival times determined in process P2. At process P5, the power consumed by each MUX circuit in the original circuit design is determined. At process P6, the power consumed by each transition once MUX circuit in the modified circuit design is determined. At process P7, the power consumption determined at processes P5 and P6 is compared for each pair of MUX circuits and transition once MUX circuits and downstream logic fed by the output of the MUX circuit. If the power consumption of a transition once MUX circuit in the modified circuit design is less than the power consumption of the corresponding MUX circuit and downstream logic fed by the output of the MUX circuit in the original circuit design (YES at process P8), the transition once MUX circuit is used in the final circuit design at process P9. If the power consumption of a transition once MUX circuit in the modified circuit design is not less than the power consumption in the corresponding MUX circuit in the original circuit design (NO at process P8), the corresponding MUX circuit in the original circuit design is used in the final circuit design at process P10. At process P11, the final circuit design is locked-in.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The invention claimed is:

1. A low power multiplexer (MUX) circuit, comprising:
    a first data input coupled to an input of a first pass gate device;
    a second data input coupled to an input of a second pass gate device;
    a hold latch having an input coupled to a data output of the MUX circuit and an output coupled to an input of a supplemental pass gate device; and
    a pulse generator for generating a HOLD pulse signal, wherein the HOLD pulse signal is coupled to a control input of the supplemental pass gate device, the pulse generator including:
    a toggle latch, wherein a toggle input of the toggle latch is coupled to a clock signal;
    an exclusive OR (XOR) gate, wherein an output of the XOR gate comprises the HOLD pulse signal; and
    a delay block, wherein an input of the delay block is coupled to an output of the toggle latch;
    wherein an output of the delay block is coupled to a first input of the XOR gate and wherein the output of the toggle latch is coupled to a second input of the XOR gate.

2. The MUX circuit according to claim 1, further comprising:
    a first select signal for selecting the first data input, the first select signal coupled to a first input of a first AND gate;

a second select signal for selecting the second data input, the second select signal coupled to a first input of a second AND gate; and an output gating signal coupled to a second input of the first AND gate and to a second input of the second AND gate;

wherein an output of the first AND gate is coupled to a control input of the first pass gate device, and wherein an output of the second AND gate is coupled to a control input of the second pass gate device.

3. The MUX circuit according to claim 2, further comprising an inverter, wherein the HOLD pulse signal is coupled to an input of the inverter, and wherein an output of the inverter comprises the output gating signal coupled to the first input of the first AND gate and to the first input of the second AND gate.

4. The MUX circuit according to claim 1, wherein the hold latch includes a clock input coupled to the clock signal.

5. MUX circuit according to claim 1, wherein the delay block provides a delay that is greater than a time required for an input data signal to settle to a valid value at the first and second data inputs of the MUX circuit.

6. A transition one multiplexer (MUX) circuit, comprising:
a first data input coupled to an input of a first pass gate device;
a second data input coupled to an input of a second pass gate device;
a hold latch having an input coupled to a data output of the MUX circuit and an output coupled to a supplemental pass gate device; and
a pulse generator for generating a HOLD pulse signal, wherein the HOLD pulse signal is coupled to a control input of the supplemental pass gate,
wherein the pulse generator further includes:
a first toggle latch, wherein a toggle input of the first toggle latch is coupled to a clock signal;
a second toggle latch, wherein a toggle input of the second toggle latch is coupled to a delayed clock signal;
an exclusive OR (XOR) gate, wherein an output of the XOR gate comprises the HOLD pulse signal; and
a delay block, wherein an input of the delay block is coupled to an output of the second toggle latch;
wherein an output of the delay block is coupled to a first input of the XOR gate and wherein an output of the first toggle latch is coupled to a second input of the XOR gate.

7. The MUX circuit according to claim 6, further comprising:
a first logic gate having a first input coupled to a select signal for selecting the first data input and a second input coupled to an output gating signal; and a second logic gate having a first input coupled to a select signal for selecting the second data input and a second input coupled to the output gating signal, wherein an output of the first logic gate is coupled to a control input of the first pass gate device, and wherein an output of the second logic gate is coupled to a control input of the second pass gate device.

8. The MUX circuit according to claim 7, further comprising an inverter, wherein the HOLD pulse signal is coupled to an input of the inverter, and wherein an output of the inverter comprises the output gating signal coupled to the first input of the first logic gate and to the first input of the second logic gate.

9. The MUX circuit according to claim 6, wherein the delay block provides a delay that is greater than a time required for an input data signal to settle to a valid value at the first or second data inputs of the MUX circuit.

10. The MUX circuit according to claim 6, further comprising a clock tree for providing the clock signal and the delayed clock signal.

11. A method for multiplexing, comprising:
generating a HOLD pulse signal by:
applying a clock input to a toggle input of a toggle latch to generate a first signal at an output of the toggle latch;
applying a delay to the first signal to provide a second signal; and
inputting the first and second signals to an exclusive OR (XOR) gate, the XOR gate outputting the HOLD pulse signal;
outputting, based on the HOLD pulse signal, a previously valid input data signal held in a hold latch as a data output signal until a new valid input data signal is available; and
outputting, based on an inverse of the HOLD pulse signal, the new valid input data signal as the data output signal.

12. The method according to claim 11, further comprising:
passing the HOLD pulse signal through an inverter to generate an output gating signal;
inputting the output gating signal and a select signal to an AND gate to generate a control signal; and
controlling a pass gate device using the control signal to pass the new valid input data signal as the data output signal.

13. The method according to claim 11, further comprising:
controlling a pass gate device using the HOLD pulse signal to pass the previously valid input data signal held in the hold latch as the data output signal.

* * * * *